United States Patent [19]

Masakazu et al.

[11] Patent Number: 5,079,065
[45] Date of Patent: Jan. 7, 1992

[54] PRINTED-CIRCUIT SUBSTRATE AND METHOD OF MAKING THEREOF

[75] Inventors: Shimizu Masakazu; Koji Udagawa; Ishiguro Yousuke, all of Kanagawa, Japan

[73] Assignee: Fuji Xerox Co., Ltd., Tokyo, Japan

[21] Appl. No.: 502,807

[22] Filed: Apr. 2, 1990

[51] Int. Cl.⁵ .............................................. B32B 9/00
[52] U.S. Cl. ................................... 428/137; 428/209; 428/457; 428/901; 361/397; 427/96; 156/60
[58] Field of Search ............... 428/137, 209, 457, 901, 428/220; 361/397; 427/96; 156/60

[56] References Cited

U.S. PATENT DOCUMENTS

| | | | |
|---|---|---|---|
| 4,518,764 | 5/1985 | Tanaka et al. | 528/271 |
| 4,894,271 | 1/1990 | Hani et al. | 428/211 |
| 4,923,678 | 5/1990 | Benedikt et al. | 428/332 |

FOREIGN PATENT DOCUMENTS

| | | |
|---|---|---|
| 59-13397 | 1/1984 | Japan . |
| 60-81899 | 5/1985 | Japan . |
| 62-86793 | 4/1987 | Japan . |
| 2081091 | 4/1987 | Japan . |

Primary Examiner—Patrick J. Ryan
Attorney, Agent, or Firm—Finnegan, Henderson, Farabow, Garrett, and Dunner

[57] ABSTRACT

The present invention is directed toward a printed-circuit substrate comprisng a first layer having through holes formed through a sheet impregnated with resin which shows a half-hardened property at the time of impregnation, a first electrically conductive circuit provided on the sheet, and a second layer having an electrically conductive circuit provided on either a metal or resin substrate. The first and second layers are pressure-stuck to each other and the through holes are filled with an electrically conductive material. The present invention is also directed to a method of making a printed-circuit substrate comprising the steps of: forming through holes and a first electrically conductive circuit respectively throgh and on at least one layer of a sheet impregnated with resin which shows a half-hardened property at the time of impregnation, thereby forming a first layer; forming a second electrically conductive circuit on an insulating plate having through holes formed therein and plating said through holes and opposite surfaces of the insulating plate, thereby forming a second layer; heat sticking said first layer onto said second layer; and filling said through holes with an electrically conductive material, thereby electrically connecting the first and second electrically conductive circuits.

26 Claims, 8 Drawing Sheets

PRINTED-CIRCUIT SUBSTRATE AND METHOD OF MAKING THEREOF

FIELD OF THE INVENTION

The present invention relates to a printed-circuit substrate in which a substrate provided with a first electrically conductive circuit is laminated on a sheet provided with a second electrically conductive circuit and a method of making thereof.

DESCRIPTION OF THE PRIOR ART

Conventionally, a wiring substrate constitutes an insulating layer of epoxy resin or the like which is formed on a metal such as iron, aluminum or the like. An electrically conductive circuit of copper foil or the like is then formed on the insulating layer. Wiring substrates in which an electrically conductive circuit of copper foil or the like is formed on a hard substrate of phenol resin or the like have been used for various purposes. In such wiring substrates, however, as the density of electrically conductive circuits formed on the substrates increases it has become necessary to form a two-layer structure in which the circuits are made to cross each other.

Conventional two-layer systems are shown in FIGS. 3 through 5.

FIG. 3 shows a printed-circuit substrate formed according to a first system. In this printed-circuit substrate, an insulating layer 2 of epoxy resin or the like is provided on a metal plate 1, and a first electrically conductive circuit 3 of copper foil or the like is further formed through a well-known method such as etching or the like. A solder resist of, for example, epoxy resin or the like is formed on the first electrically conductive circuit 3 through printing or the like so that the solder resist acts as an insulating layer 4. Holes 5 are formed through the insulating layer for electrical connection for the first electrically conductive circuit 3.

Thereafter, a second electrically conductive circuit 6 is formed with an electrically conductive paste. The electrically conductive paste is made of a resin having carbon powder, copper, silver, or the like mixed therein. At this time, the holes 5 are filled with the electrically conductive paste in the resin group so that the first electrically conductive circuit 3 and the second electrically conductive circuit 6 are electrically connected to each other. Further, a solder resist 7 is provided as a cover for protecting the conductor.

Next, FIG. 4 shows a second system.

This printed-circuit substrate is called a metal core substrate. After holes 8 are formed through a metal plate 1, the metal plate 1 is covered with an insulating layer 2 of epoxy resin or the like. Holes 9 are then formed through the insulating layer 2. Next, an electrically conductive circuit 10 is formed on the front and back surfaces of the substrate through a well known plating method.

FIG. 5 shows the steps of producing a third system of a substrate using hard resin.

In this system, a first electrically conductive circuit 12 of copper foil is formed, through means such as etching or the like, on one surface of an insulating sheet 11 of polyimide resin, polyether resin, or a material having similar heat-resisting and insulating properties. An adhesive sheet 13 is formed on the other surface of the insulating sheet 11. Through holes 14 are provided in the lamination structure for connection of electrically conductive layers. Through holes 17 are provided for connection of electrically conductive layers as well as lead wires 16 of electric parts 15.

A second electrically conductive circuit 19 of copper foil is formed on a hard substrate 18 of phenol resin, epoxy resin, or the like by etching, for example, in order to form another lamination structure. Through holes 20 through which the lead wires 16 of the electric parts 15 are passed are formed in this lamination structure.

The two lamination structures thus formed are pressure-stuck on each other through the adhesive sheet 13.

Portions not to be soldered are covered with a solder resist 21 through printing. Through holes 14 and 17 are soldered with solder 22 after insertion of the lead wires 16 of the electric parts 15 therein. Consequently, the first electrically conductive circuit 12 and the second electrically conductive circuit 19 are electrically connected to each other.

However, the first system shown in FIG. 3 has a disadvantage in that the electrically conductive paste for use as the second electrically conductive circuit 6 has poor moisture and heat resistance. Thus, the resistance value of the electrically conductive circuit may vary largely as the external temperature and humidity change. Further the first system has another disadvantage in that it is difficult to make reliable elongated electrically conductive circuits. That is, if the electrically conductive paste is made of a resin containing carbon powder, poor conductivity will result due to the relatively high resistivity thereof, $10^{-2}$ ohm cm. If copper is mixed in the resin, poor conductivity will result due to oxidation of the copper. If silver powder is mixed in the resin, shorting may result due to migration of the silver.

In the second system shown in FIG. 4, the steps of forming the insulating layer and forming the electrically conductive circuit are complicated and expensive.

In the third system shown in FIG. 5, it is necessary to stick the adhesive sheet 13 on the insulating sheet 11 thereby making the process complicated and expensive. The adhesive sheet 13 may be a pressure-sensitive such as an acrylic resin or the like. The adhesive sheet 13 may be a heat-setting type such as an epoxy resin or the like. The adhesive sheet that is pressure-sensitive such as an acrylic resin or the like is inexpensive but has no solvent resistance and has extremely low adhesive strength at a temperature not lower than 50° C. Accordingly, in forming a printed-circuit substrate, soldering of the adhesive sheet cannot be performed automatically. Instead, manual soldering is required. Therefore, the number of steps becomes large, and the adhesion portion is apt to be peeled so that cracks or electrical disconnection may be caused in the soldering portions thereby lowing reliability. Further, the adhesive sheet of the latter heat setting type such as an epoxy resin or the like, is expensive and difficult to work with.

A prior art method of producing a multilayer printed-circuit board is shown in FIG. 12.

In FIG. 12, metal foil 52 such as copper foil or the like is laminated on one surface of an insulating plate 51 such as glass fiber fabric or the like impregnated with epoxy resin varnish or the like, the laminate is shape under application of heat and pressure resulting in a into a metal foil single covered laminate 53. Further, metal foil 52 such as copper foil or the like is laminated on each of opposite surfaces of an insulating plate 51 such as glass fiber fabric or the like impregnated with epoxy resin varnish or the like, and the laminate is shaped under application of heat and pressure resulting in a metal foil double covered laminate 54.

Through holes 55 and 56 are bored in the laminates 53 and 54 respectively by means of a drill or the like for use in positional registration between the laminates 53 and 54 at the time of lamination of those laminates thereafter. Then, the metal foil 52 on each surface of the metal foil double covered laminate 54 is patterned into a desired wiring circuit with corrosion resistant ink. Next, the metal foil double covered laminate 54 is immersed in an etching solution (for example, a ferric chloride solution, an ammonium persulfate solution, or the like) so that portions of the metal foil 52 unnecessary for the wiring circuits are corroded and removed and electrically conductive circuits 57 are formed on the insulating plate 51.

The metal foil single covered laminate 53 is laminated on each surface of the resulting printed-circuit board 54a through an insulating plate 58 called a "prepreg". That is, the insulating plate 58 constitutes a glass fiber fabric impregnated with epoxy resin. The insulating plate 58 is also in a half hardened state (B stage). The resultant laminate of the laminates 53 and the printed-circuit board 54a are shaped under application of heat and pressure so as to be united into one multilayer body. Thereafter, through holes 59 are bored through the circuit board by means of a drill. Then, the through holes 59 and the surface of the metal foil 52 on each of the metal foil single covered laminates 53 located at the outermost layer portions are subject to through-hole plating 510. Next, each metal foil 52 is patterned into a desired wiring circuit by a photographing method, and unnecessary portions of the metal foil 52 is removed through, so that electrically conductive circuits 511 are formed.

However, the electrically conductive circuits formed by the process shown in FIG. 12 are not reliable due to the low heat resistance of the epoxy resin. That is, while the through holes 59 are bored, a "smear phenomenon" occurs in which the epoxy resin, softened by heat generated by the boring procedure, adheres to the inner surfaces of the through holes 59.

Further, since the exposed surfaces of the through holes 59 are small, an "inner layer separation phenomenon" occurs in which a plating portion separates from the exposed surfaces of through holes 59.

SUMMARY OF THE INVENTION

It is therefore an object of the present invention to overcome the above disadvantages so as to provide a printed-circuit substrate which requires no adhesive agent, is easy to manufacture, and is highly reliable.

Another object of the present invention to eliminate the foregoing disadvantages so as to provide a method of producing a multilayer printed-circuit board in which the smear and inner layer separation phenomena are eliminated.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

In order to solve the aforementioned problems, according to an aspect of the present invention, the printed-circuit substrate in which a metal is used as a substrate, is characterized in that the printed-circuit substrate comprises a first layer having through holes formed through a sheet impregnated with resin, which shows half-hardened property at the time of impregnation, and a first electrically conductive circuit provided on the sheet, and a second layer having an electrically conductive circuit provided on a metal substrate, the first layer and the second layer being heat pressure-stuck on each other, the through holes being filled with the electrically conductive material so that the first electrically conductive circuit is electrically connected to the second electrically conductive circuit.

According to another aspect of the present invention, the printed-circuit substrate in which hard resin is used as a substrate, is characterized in that the printed-circuit substrate comprises a first layer having first through holes formed through a sheet impregnated with resin, which shows half-hardened property at the time of impregnation, and a first electrically conductive circuit provided on the sheet, and a second layer having second through holes formed through a resin substrate at positions corresponding to the first through holes and a second electrically conductive to the first through holes and a second electrically conductive circuit provided on the resin substrate, the first layer and the second layer being heat pressure-stuck on each other, the through holes being filled with an electrically conductive material so that the first electrically conductive circuit is electrically connected to the second electrically conductive circuit.

According to the present invention, since a sheet impregnated with resin having a half-hardened property is used, the sheet itself is an adhesive sheet. Accordingly, the first and second layers can be united into a single body by heat-pressure-sticking. A method of producing a multilayer printed-circuit board according to the present invention comprises the steps of: forming through holes and a first electrically conductive circuit respectively through and on at least one layer of a sheet impregnated with resin which shows half-hardened property at the time of impregnation to thereby prepare a first layer constituted by the at least one layer; forming a wiring circuit on an insulating plate having through holes formed through the insulating plate and subjected to through-hole plating after lamination of metal foil on opposite surfaces of the insulated plate to thereby prepare a second layer having a second electrically conductive circuit; heat-sticking the first layer onto the second layer; and filling the through holes with an electrically conductive material so that the first and second electrically conductive circuits are electrically connected to each other.

According to the present invention, after the metal foil has been laminated on the insulating plate and the through holes have been formed, through-hole plating is performed to thereby form the second layer. Therefore, the metal foil is always in plane-contact with through-hole plating portions so that there is no possibility of occurrence of defective contact at those portions. Further, when the first layer is heat pressure-stuck onto the second layer and the through holes are filled with the electrically conductive material, the through-hole plating portions of the second layer are in plane-contact with the electrically conductive material so that there is no possibility of occurrence of defective contact in those portions.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Figure 1:
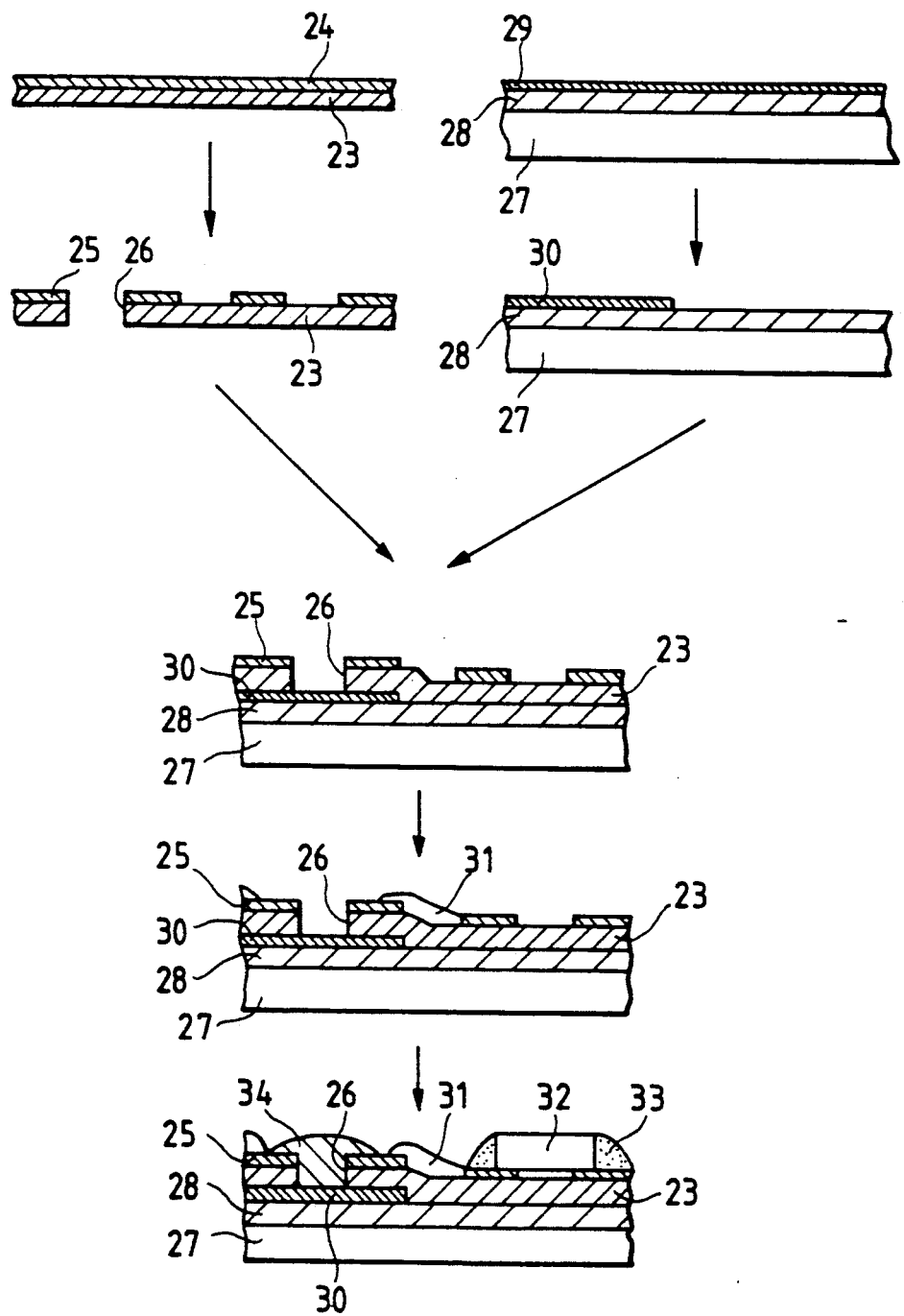
FIG. 1 shows a printed circuit according to an embodiment of the present invention and a process for making thereof.

FIG. 1 shows a first embodiment of the printed-circuit substrate according to the present invention.

The reference numeral 23 designates an insulating sheet impregnated with resin which has a half-hardened property at the time of impregnation. A preferred embodiment of the insulating sheet may be a half-hardened (B stage) sheet of aromatic polyamide fiber unwoven cloth or of glass woven cloth impregnated with a composition comprising a diallyl phthelate resin, such as diallyl orthophthalate, diallyl isophthalate, diallyl terephthalate, or the like. An electrically conductive body 24 of copper foil or the like is stuck on one surface of the insulating sheet 23 so that a first electrically conductive circuit 25 is formed through a well-known etching method, and through holes 26 are formed by means of a drill or a punch for connection of the electrically conductive circuit.

On the other hand, an insulating layer 28 of epoxy resin or the like is formed on a metal plate 27 of iron, aluminum, or the like and an electrically conductive body 29 of copper foil or the like is stuck on the insulating layer 28 so that a second electrically conductive circuit 30 is similarly formed through a well-known etching method.

A laminate in which the insulating sheet 23 and the first electrically conductive circuit 25 are formed on the insulating sheet 23, and another laminate in which the metal plate 27 and the second electrically conductive circuit 30 are formed on the metal plate 27 are heat-pressure-stuck on each other under the conditions of a temperature of 140°~180° C., pressure of 30~60 kg/cm$^2$, and the time of 30 minutes. It is preferable that the through holes 26 are filled with a filler comprising an epoxy, a material containing silicon, or the like so as to prevent resin flow from occurring at the time of heat-pressure-sticking. After removal of the filler material after the heat pressure-sticking, a solder resist 31 is formed through a well-known method such as printing or the like on a portion unnecessary to be soldered, and electronic elements 32 of the like are mounted and soldered by solder 33.

At this time, the through holes 26 are filled with an electrically conductive material 34. The electrically conductive material 34 may be the solder which is formed at the time of automatic soldering or may be filled by use of a filling matching. In the case of use of electrically conductive paste, however, it is preferable to cover the electrically conductive paste with the solder resist 31.

The resulting wiring substrate has large peeling strength of 1.3 kg/cm$^2$ or more after thermally hardened, so that it is superior in heat resistance and solvent resistance.

Figure 2:
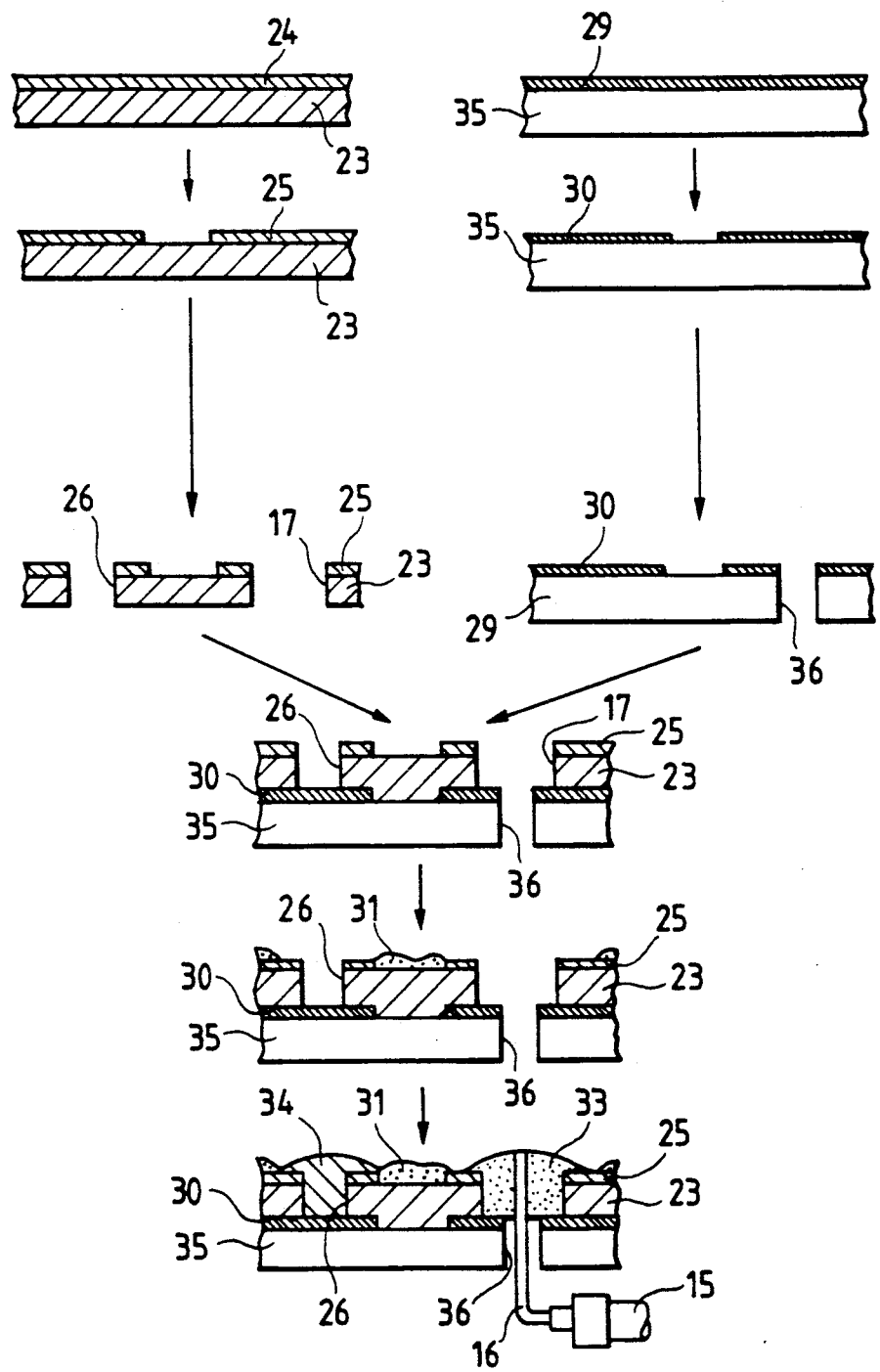
FIG. 2 shows a printed circuit according to another embodiment of the present invention and a process for making thereof.
Figure 3:
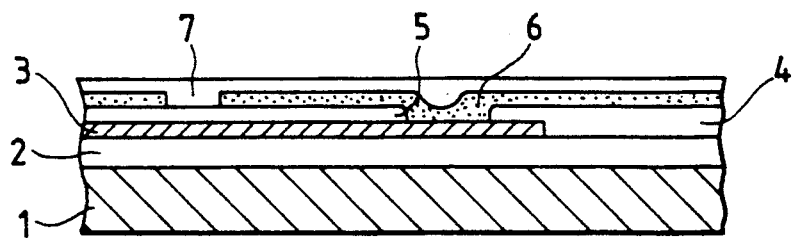
FIGS. 3 and 4 are sectional views of conventional printed circuits.
Figure 4:
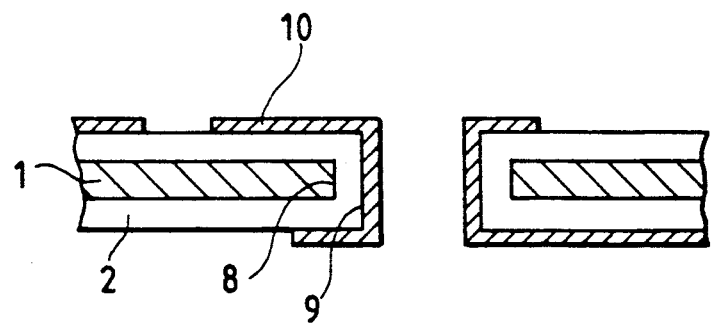
Figure 5:
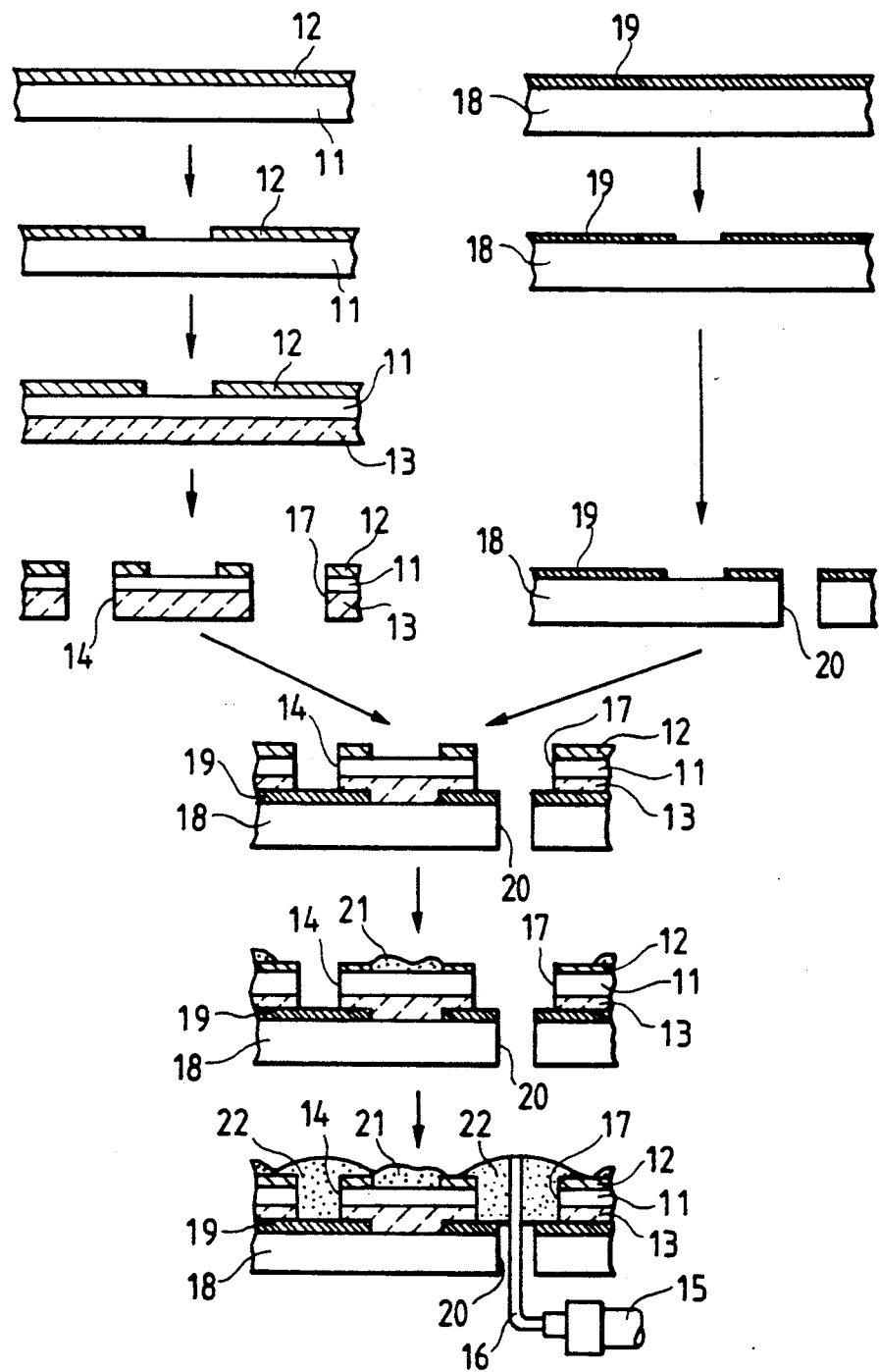
FIG. 5 shows a process for making a conventional printed circuits.

Referring to FIG. 2, a second embodiment using hard resin as a substrate will be described hereunder.

An insulating sheet 23 is an insulating sheet, similarly to the case of the first invention described above, impregnated with resin which has half-hardened property at the time of impregnation. The insulating sheet may be a half-hardened (B stage) sheet of aromatic polyamide fiber unwoven cloth or of glass woven cloth impregnated with a composition utilizing a diallyl phthalate resin, such as diallyl orthophthalate, diallyl isophthalate, diallyl terephthalate or the like. An electrically conductive body 24 of copper foil or the like is stuck on one surface of the insulating sheet 23, similarly to the case of the first invention described above, so that a first electrically conductive circuit 25 is formed through a well-known etching method, and through holes 26 are formed by means of a drill or a punch for connection of the electrically conductive circuit. Further, through holes 17 are formed for connection of the electrically conductive circuits as well as lead wires 16 of electric parts 15.

On the other hand, an electrically conductive body 29 of copper foil or the like is stuck on a hard substrate 35 of phenol resin, epoxy resin, or the like so that a second electrically conductive circuit 30 is similarly formed through a well-known etching method, the holes 36 through which the lead wires 16 of the electric parts 15 are passed are formed by means of a drill or a punch.

A laminate in which the insulating sheet 23 and the first electrically conductive circuit 25 are formed on the insulating sheet 23, and another laminate in which the metal plate 27 and the second electrically conductive circuit 30 are formed on the metal plate 27 are heat pressure-stuck on each other under the conditions of a temperature of 140°~180° C., pressure of 30~60 kg/cm$^2$, and time of 30 minutes. It is preferable that the through holes 26 are filled with a filler containing a epoxy, a material containing silicon, or the like so as to prevent resin flow from occurring at the time of heat-pressure-sticking. After removal of the filler material after the heat pressure-sticking. After removal of the filler material after the heat pressure-sticking, a solder resist 31 is formed through a well-known method such as printing or the like on a portion unnecessary to be soldered, and the lead wires 16 of the electric parts 15 are passed and soldered by solder 33.

At this time, the through holes 26 are filled with an electrically conductive material 34. The electrically conductive material 34 may be the solder which is formed at the time of automatic soldering or may be soldering paste which is filled and heated. Before formation of the solder resist 31, electrically conductive paste of copper, silver, or the like may be screen-printed or may be filled by use of a filling matching. If an electrically conductive paste is used, however, it is preferable to cover the electrically conductive paste with the solder resist 31.

Figure 6:
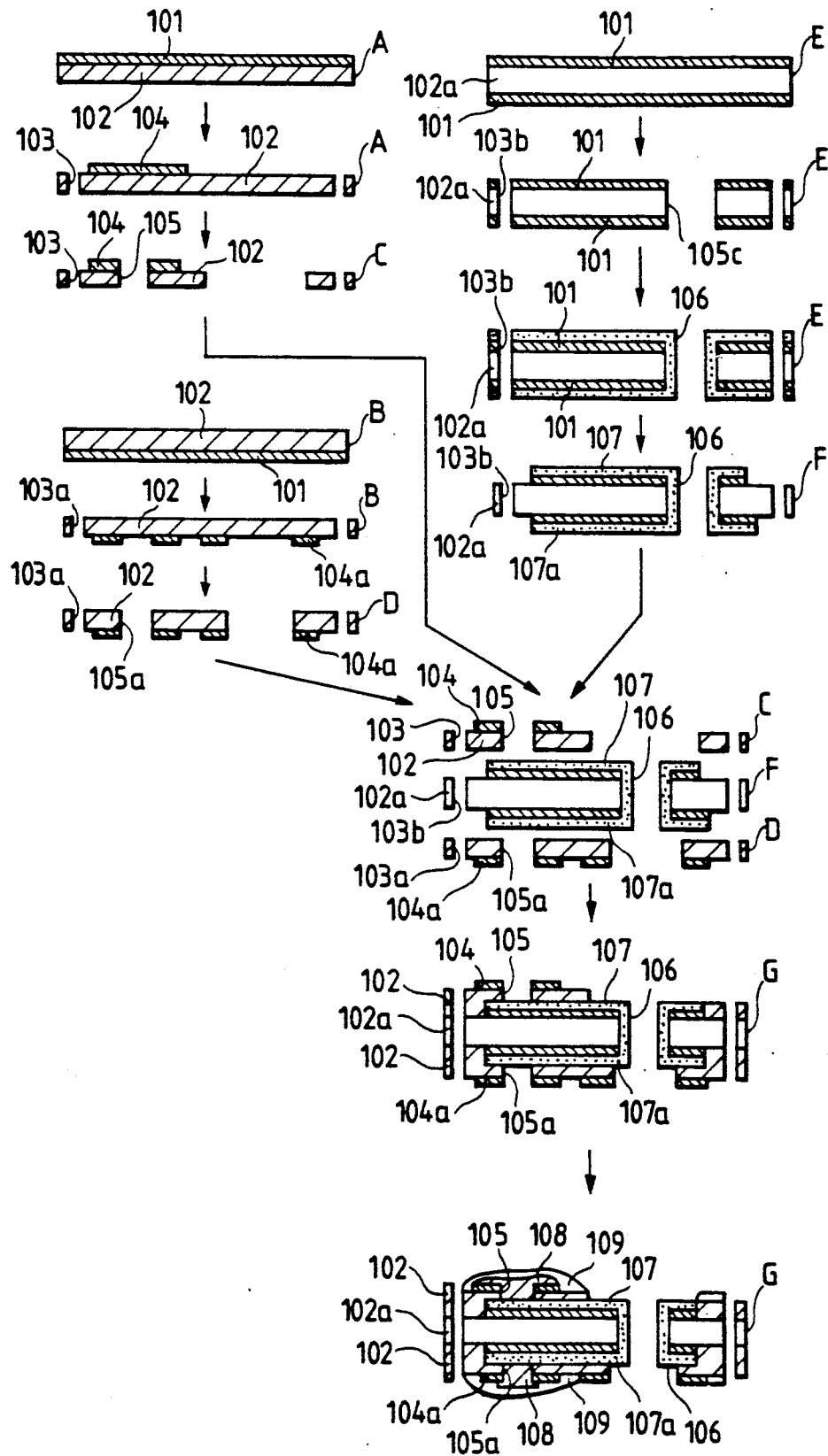
FIG. 6 shows a process for making a printed circuit according to the present invention.

The present invention is not limited to the "single-sided" printed circuits described above, in which electrically conductive circuits are provided only on one side of a printed-circuit substrate. The present invention is also directed toward printed-circuit substrates in which electrically conductive circuits are provided on both sides of the printed-circuit substrate. Accordingly, a method of producing a printed-circuit substrate having electrically conductive circuits on both sides of the printed-circuit substrate will now be described in reference to FIG. 6.

The reference numeral 101 designates metal foil of copper, aluminum, or the like stuck onto one surface of an insulating sheet 102 and onto each of the opposite surfaces of an insulating plate 102a. The reference numeral 102 designates an insulating sheet impregnated with resin which shows half-hardened property at the time of impregnation. A preferable embodiment of the insulating sheet 102 is a sheet which is constituted by nonwoven fabric of aromatic polyamide fiber woven fabric or glass fiber fabric impregnated with a composition of resin containing a diallyl phthalate (for example, diallyl orthophthalate, diallyl isophthalate, or diallyl terephthalate) and which is in a half-hardened state (B stage). The metal foil 101 is stuck onto each insulating sheet 102 to thereby form metal foil single covered laminates A and B. Through holes 103 and 103a for use for positional registration between the laminates A and B at the time of lamination of those laminates are bored through the metal foil single covered laminates A and B, respectively. Further, each metal foil is patterned into a desired wiring circuit with corrosion-resistant ink or resist, and portions of the metal foil 101 unnecessary for the wiring circuit are corroded and removed by a well-known etching method so that electrically conductive circuits 104 and 104a are formed on the metal foil single covered laminates A and B, respectively. Next, through holes 105 and 105a for use for connection of the electrically conductive circuits and for mounting of electronic elements are bored by means of a drill or a press. Since electrically conductive circuits are formed on only one side of printed-circuit boards C and D, printed-circuit boards C and D are termed "single-sided".

The reference numeral 102a designates an insulating plate such as glass fiber fabric or the like impregnated with epoxy resin varnish or the like. The metal foil 101 is laminated on each of the opposite surfaces of the insulating plate 102a, and the laminate is shaped under application of heat and pressure to thereby form a metal foil double covered laminate E. Through holes 103b for use for positional registration at the time of lamination thereafter and through holes 105c for use of connection of electrically conductive circuits and/or for mounting of electronic elements or the like are bored through the metal foil double covered laminate E. Then, the laminate E is subject to through-hole plating 106 by using a well-known electroless plating method, a well-known electrolytic plating method, or the like. Desired wiring circuits are patterned on the through-hole plating 106 by a photographing method, and unnecessary portions are removed by etching so that electrically conductive circuits 107 and 107a are formed. Since electrically conductive circuits 107 and 107a are formed on both sides of printed-circuit board F, printed-circuit board F is termed "double-sided".

The double-sided printed-circuit board F is sandwiched between the single-sided printed-circuit boards C and D, and the laminate is subject to heat-pressure-sticking under the conditions of the temperature of 140°–180° C., the pressure of 30–60 kg/cm$^2$, and the time of 30 minutes. In the heat-pressure-sticking, the through holes 105 and 105a may be filled with a filler containing an epoxy, a material containing silicon, or the like, so as to prevent the resin from flowing at the time of heat-pressure-sticking. After the heat-pressure-sticking, the filler is removed, and the through holes 105 and 105a are filled with resin paste 108 containing copper or silver powder by means of a printing or filling machine, and then a solder mask 109 containing epoxy resin or the like as a main component is applied by printing to thereby complete the production of a multilayer printed-circuit board G.

Further, at the time of lamination, pins are inserted into the positioning through holes 103, and 103a, and 103b so that the laminates are prevented from displacing from their registered positions. A diallyl phthalate resin is used for the above-mentioned insulating sheet 102. In the case where a multilayer printed-circuit board is produced by using the above-mentioned epoxy resin together with polyimide used as the heat-resistant resin having the same function as the diallyl phthalate resin, however, the adhesion between the polyimide and the electrically conductive circuits as well as the adhesion between the polyimide layer and the epoxy layer are insufficient, 0.5~1.2 kg/cm. Accordingly polyimide cannot be used.

Figure 7:
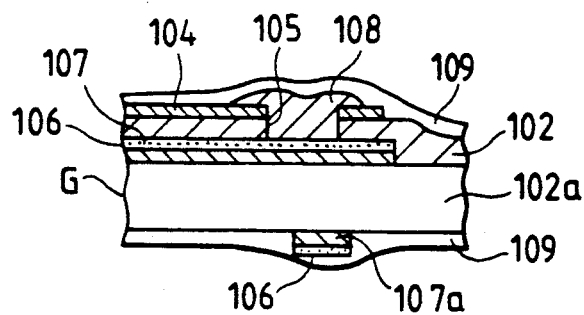
FIG. 7 shows an electrical connection between conductive layers on a surface of an insulating plate.

As shown in FIG. 7, the insulating sheet 102 having the through holes 105 is heat-pressure-stuck onto the electrically conductive circuit 107 formed on the insulating plate 102a, and the through holes 105 are filled with the electrically conductive paste 108 containing a resin by means of a printing or filling machine to thereby provide electrical connections.

Figure 8:
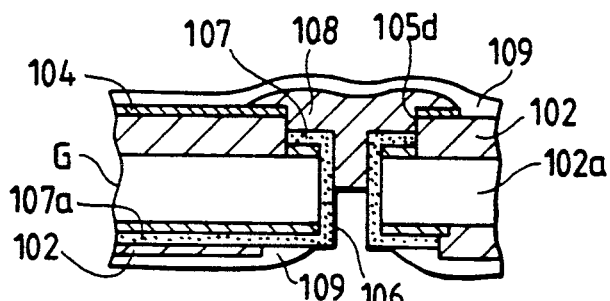
FIG. 8 shows an electrical connection through an insulating plate via a through hole plating.

FIG. 8 explains a system for electrical connection between an electrically conductive circuit of a single-sided printed-circuit board and electrically conductive circuits of a double-sided printed-circuit board. The electrical connection between the electrically conductive circuit 104 of the single-sided printed-circuit board and the electrically conductive circuit 107a of the double-sided printed-circuit board is performed in such a manner that the electrically conductive circuits 107a and 107 are connected to each other through the through-hole plating 106, and the electrically conductive circuit 107 and the electrically conductive circuit 104 of the single-side printed-circuit board are electrically connected to each other by filling through holes 105d with a conductive paste 108 containing a resin.

Figure 9:
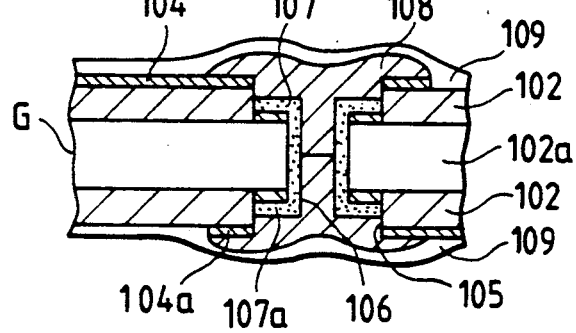
FIG. 9 shows an electrical connection through an insulating plate via a conductive paste.

FIG. 9 explains a system for electrical connection between electrically conductive circuits for outermost layer portions opposite to each other. That is, the electrically conductive circuit 104 of the single-sided printed-circuit board is electrically connected to the electrically conductive circuit 104a of the other single-sided printed-circuit board through electrically conductive paste 108 containing a resin packed from the opposite sides and through the through-hole plating 106 which connects the electrically conductive circuits 107a and 107 of the double-sided printed-circuit board.

Figure 10:
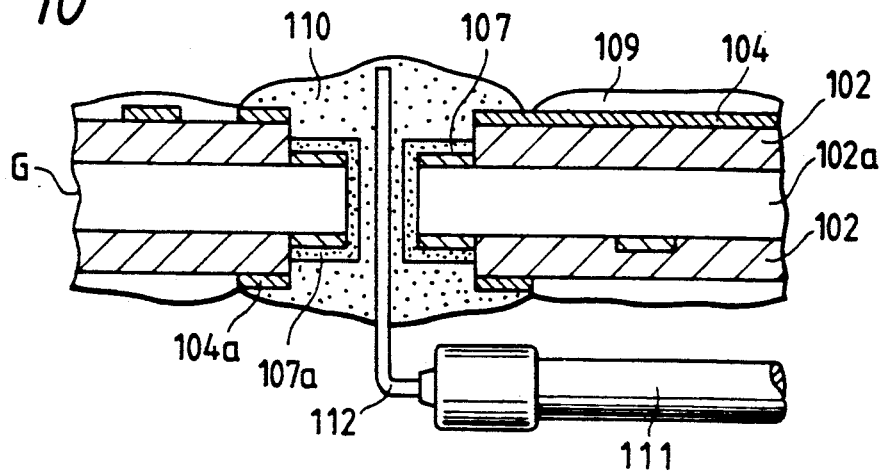
FIG. 10 shows a mounted printed circuit according to the present invention.

As seen in FIG. 10, solder 110 is used in place of the electrically conductive paste containing a resin. When a lead wire 112 of an electronic element 111 is inserted through the through hole and the through hole is filled with the solder 110, the electrical connection between the electrically conductive circuits and the fixing of the electronic element 111 are performed at the same time.

Figure 11A:
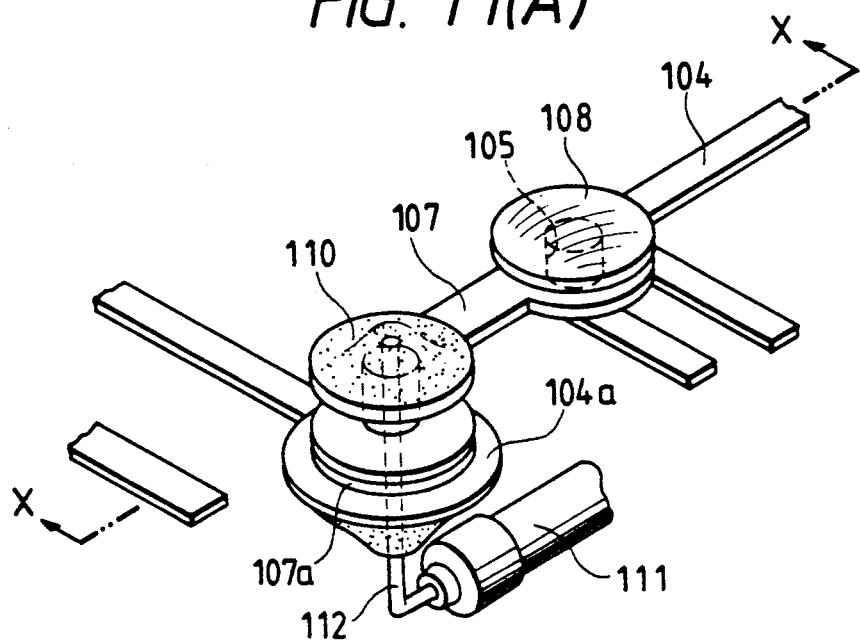
FIG. 11(A) shows an electrical connection through an insulating plate via conductive paste and solder.
Figure 11B:
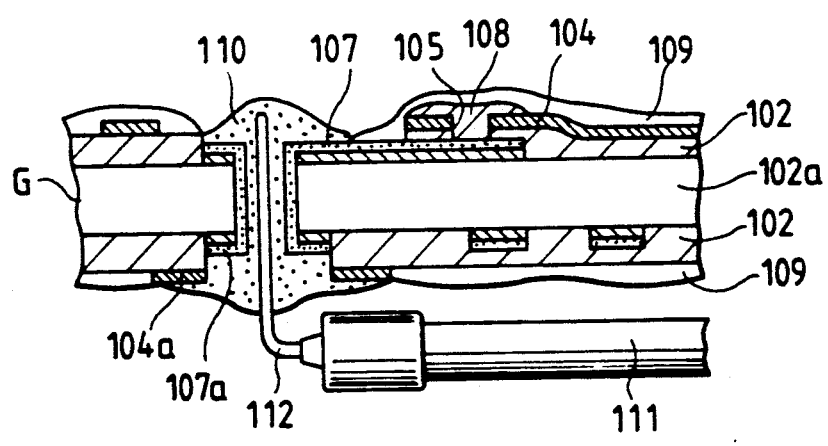
FIG. 11(B) is a cross section taken along line X—X of FIG. 11(A).
Figure 12:
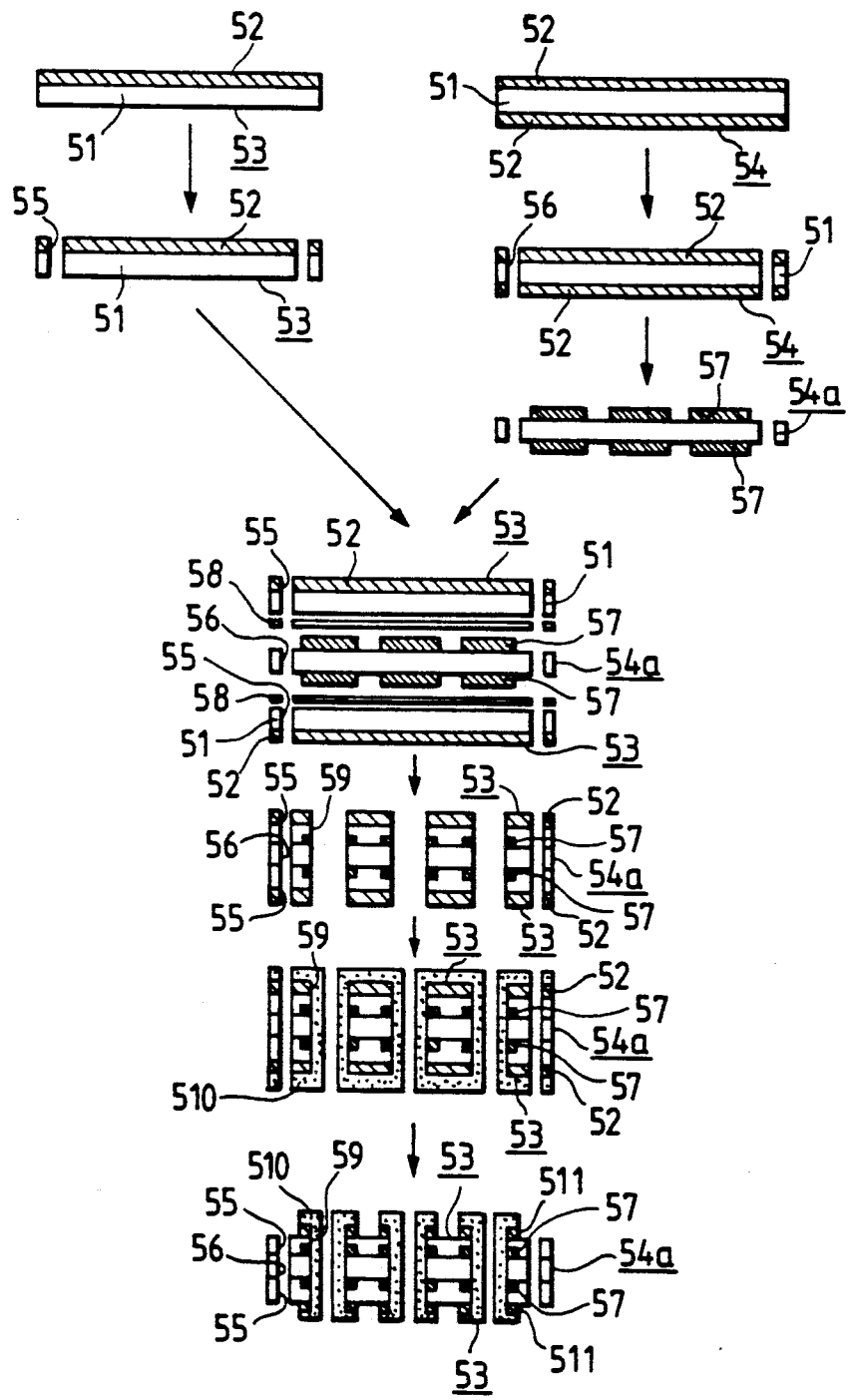
FIG. 12 shows a prior art method of making a printed-circuit board.

FIG. 11(A) shows an embodiment in which the electrical connection by means of both electrically conductive paste containing a resin and solder. FIG. 11(B) is a cross section taken on line X—X of FIG. 11(A).

An electrically conductive circuit 104 of a single-sided printed-circuit board is electrically connected to an electrically conductive circuit 107 of a double-sided printed-circuit board through electrically conductive paste containing a resin 108, and other portions are electrically connected to each other through solder 110.

As described above, according to the present invention, the configuration and manufacturing process of the printed-circuit substrate are extremely simplified, and automatic soldering can be employed in mounting electric parts or the like because the composition containing a diallyl phthalate is superior in heat resistance and solvent resistance. Further, the high peeling strength of this composition after thermal hardening, 1.3 Kg/cm$^2$ or more, yields reliable electrical connections.

In addition, due to the through-hole plating between the electrically conductive circuits of the inner and outer layer, no "smear phenomenon" occurs at the time of formation of the through holes. Further, no "inner layer separation phenomenon" occurs because unetched portions of an inner layer are used as connection faces.

It will be apparent to those skilled in the art that various modifications and variations can be made in the printed circuit substrate of the present invention and in the process of making this printed circuit substrate without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A printed-circuit substrate, comprising:
    a first layer having through holes formed through a sheet impregnated with resin which is incompletely hardened and is an adhesive at the time of impregnation,
    a first electrically conductive circuit provided on said sheet, and a second layer having a second electrically conductive circuit provided on a metal substrate, said first layer and said second layer being heat pressure-struck on each other, said through holes being filled with an electrically conductive material so that said first electrically conductive circuit is electrically connected to said second electrically conductive circuit.

2. A printed-circuit substrate according to claim 1, wherein said resin which is incompletely hardened and is an adhesive contains diallyl phthalate.

3. A printed-circuit substrate according to claim 1 wherein said electrically conductive material, with which said penetrating hole is filled, is solder or electrically conductive paste.

4. A printed-circuit substrate comprising:
    a first layer having first through holes formed through a sheet impregnated with resin which is incompletely hardened and is an adhesive at the time of impregnation and a first electrically conductive circuit provided on said sheet;
    a second layer having second through holes formed through a resin substrate at positions corresponding to said first through holes and a second electrically conductive circuit provided on said resin substrate;
    said first layer and said second layer being heat pressure-struck to each other, said through holes being filled with an electrically conductive material so that said first electrically conductive circuit is electrically connected to said second electrically conductive circuit.

5. A printed-circuit substrate according to claim 4, wherein said resin which is incompletely hardened and is an adhesive contains diallyl phthalate.

6. A printed-circuit substrate according to claim 4, wherein said electrically conductive material, with which said penetrating hole is filled, is solder or electrically conductive paste.

7. A printed-circuit substrate, comprising:
    a first layer composed of a sheet impregnated with a diallyl phthalate based resin, said first layer having through holes formed through said sheet and a first electrically conductive circuit provided on said sheet, said resin having a half-hardened property at resin impregnation so that said sheet is not completely hardened immediately after the resin impregnation, and
    a second layer composed of an insulative substrate, said second layer having a second electrically conductive circuit provided on said insulative substrate,
    wherein said first layer is heat pressure-struck on said second layer by using the half-hardened property of said sheet, and said first and second electrically conductive circuits are electrically connected by filling said through holes with an electrically conductive material.

8. A printed-circuit substrate as claimed in claim 7, wherein said electrically conductive material, with which said through holes are filled, is solder or electrically conductive paste.

9. A printed-circuit substrate, comprising:
    a first layer composed of a sheet impregnated with a diallyl phthalate based resin, said first layer having first through holes formed through said sheet and a first electrically conductive circuit provided on said sheet, said resin having a half-hardened property at resin impregnation so that said sheet is not completely hardened immediately after the resin impregnation; and a second layer composed of an insulative substrate, said second layer having second through holes formed through said substrate and a second electrically conductive circuit provided on said insulative substrate;

wherein said first layer is heat pressure-struck on said second layer by using the half-hardened property of said sheet after aligning said first and second through holes, and said first and second electrically conductive circuits are electrically connected by filling through regions formed of said aligned first and second through holes with an electrically conductive material.

10. A printed-circuit substrate as claimed in claim 9, wherein said electrically conductive material, with which said through regions are filled, is solder or electrically conductive paste.

11. A printed-circuit substrate as claimed in claim 9, wherein lead wires for electrical parts are inserted in said through regions.

12. A printed-circuit substrate as claimed in claim 9, wherein an area of said respective second through holes is smaller than an area of said respective first through holes, and said electrically conductive material is charged in the region corresponding to the difference of the areas.

13. A printed-circuit substrate, comprising:
a first layer composed of a sheet impregnated with a diallyl phthalate based resin, said first layer having first through holes formed through said sheet and a first electrically conductive circuit provided on said sheet, said resin having a half-hardened property at resin impregnation so that said sheet is not completely hardened immediately after the resin impregnation, and an insulative substrate having second through holes formed through said substrate and second electrically conductive circuits provided on both the surfaces of said insulative substrate, said second through holes being plated;

wherein said first layer is heat pressure-struck on said insulative substrate by using the half-hardened property of said sheet, and said first and second electrically conductive circuits are electrically connected by filling said first and second through holes with an electrically conductive material.

14. A printed-circuit substrate as claimed in claim 13, wherein said electrically conductive material, with which said through holes are filled, is solder or electrically conductive paste.

15. A printed-circuit substrate as claimed in claim 13, wherein said first layer is provided on both the surfaces of said insulative substrate.

16. A printed-circuit substrate, comprising:
a first layer composed of a sheet, said first layer having first through holes formed through said sheet and a first electrically conductive circuit provided on said sheet; and a second layer composed of an insulative substrate, said second layer having second through holes formed through said insulative substrate and a second electrically conductive circuit provided on said insulative substrate;

wherein said first layer is disposed on said second layer after aligning said first and second through holes, and said first and second electrically conductive circuits are electrically connected by filling through regions formed of said aligned first and second through holes with an electrically conductive material.

17. A printed-circuit substrate as claimed in claim 16, wherein said electrically conductive material, with which said through regions are filled, is solder or electrically conductive paste.

18. A printed-circuit substrate as claimed in claim 16, wherein lead wires for electrical parts are inserted in said through regions.

19. A printed-circuit substrate as claimed in claim 16, wherein an area of said respective second through holes is smaller than an area of said respective first through holes, and said electrically conductive material is charged in the region corresponding to the difference of the areas.

20. A printed-circuit substrate, comprising:
a first layer composed of a sheet, said first layer having first through holes formed through said sheet and a first electrically conductive circuit provided on said sheet; and an insulative substrate having second through holes formed through said substrate and second electrically conductive circuits provided on both the surfaces of said insulative substrate, said second through holes being plated;

wherein said first layer is disposed on said insulative substrate, and said first and second electrically conductive circuits are electrically connected by filling said first and second through holes with an electrically conductive material.

21. A printed-circuit substrate as claimed in claim 20, wherein said first layer is provided on both the surfaces of said insulative substrate.

22. A printed-circuit substrate as claimed in claim 20, wherein said electrically conductive material, with which said through holes are filled, is solder or electrically conductive paste.

23. A printed-circuit substrate as claimed in claim 20, wherein an area of said respective second through holes is smaller than an area of said respective first through holes, and said electrically conductive material is charged in the region corresponding to the difference of the areas.

24. A method of producing a multilayer printed-circuit board comprising the steps of:
forming through holes and a first electrically conductive circuit respectively through and on at least one layer of a sheet impregnated with resin which is incompletely hardened and is an adhesive at the time of impregnation to thereby prepare a first layer constituted by said at least one layer;

forming a wiring circuit on an insulating plate having opposite surfaces, said insulating plate having through holes formed through said insulating plate and subjected to through-hole plating after lamination of a metal foil on opposite surfaces of said insulated plate to thereby prepare a second layer having a second electrically conductive circuit;

heat sticking said first layer onto said second layer; and filling said through holes with an electrically conductive material so that said first and second electrically conductive circuits are electrically connected to each other.

25. A method of producing a multilayer printed-circuit board according to claim 24, wherein said resin which is incompletely hardened and is an adhesive contains diallyl phthalate.

26. A method of producing a multilayer printed-circuit board according to claim 24, wherein said electrically conductive material, with which said through holes are to be filled, is solder or electrically conductive paste.

* * * * *